US006842340B2

(12) United States Patent
Chang

(10) Patent No.: US 6,842,340 B2
(45) Date of Patent: Jan. 11, 2005

(54) CPU AND ELECTRONIC CHIPSET COOLER

(75) Inventor: Shyy-Woei Chang, Kaohsiung (TW)

(73) Assignee: Ting-Fei Wang, Kaohsiung (TW)

(*) Notice: Subject to any disclaimer, the term of this patent is extended or adjusted under 35 U.S.C. 154(b) by 117 days.

(21) Appl. No.: 10/382,290

(22) Filed: Mar. 5, 2003

(65) Prior Publication Data
US 2004/0174677 A1 Sep. 9, 2004

(51) Int. Cl.⁷ .................................. H05K 7/20
(52) U.S. Cl. ............... 361/695; 361/687; 361/692; 361/704; 165/80.3; 454/184; 257/721
(58) Field of Search ................ 361/687, 692, 361/695, 697, 702–710, 712–718, 721–727, 736, 752; 165/80.2, 80.3, 80.4, 165, 185, 121, 122, 104.32, 104.33, 104.34; 454/184; 174/16.3, 252; 415/176–178, 211.1, 213.3, 216.1, 223; 257/690–721, 725–727; 417/423.7, 423.14

(56) References Cited

U.S. PATENT DOCUMENTS

| | | | | |
|---|---|---|---|---|
| 5,563,768 A | * | 10/1996 | Perdue | 361/695 |
| 5,676,523 A | * | 10/1997 | Lee | 415/206 |
| 5,756,931 A | * | 5/1998 | Kitahara et al. | 174/16.3 |
| 6,023,413 A | * | 2/2000 | Umezawa | 361/697 |
| 6,219,242 B1 | * | 4/2001 | Martinez | 361/704 |
| 6,501,652 B2 | * | 12/2002 | Katsui | 361/697 |
| 6,542,360 B2 | * | 4/2003 | Koizumi | 361/687 |
| 6,736,192 B2 | * | 5/2004 | Chang | 165/80.3 |

FOREIGN PATENT DOCUMENTS

JP 02000091484 A * 3/2000 ......... H01L/23/467

* cited by examiner

Primary Examiner—Michael Datskovskiy
(74) Attorney, Agent, or Firm—Alan D. Kamrath; Nikolai & Mersereau, P.A.

(57) ABSTRACT

Disclosed is an electronic chipset or CPU cooler. The cooler comprises a rectangular heat sink including four side legs securely snapped together with the chipset or CPU for forming a space between an underside of the heat sink and a top of the chipset or CPU and a plurality of apertures arranged in a form of rows and columns. A path of jets set up by the activated fan is from the fan to the top of the chipset or CPU via the apertures and the space. The invention has several configurations.

5 Claims, 5 Drawing Sheets

CPU AND ELECTRONIC CHIPSET COOLER

FIELD OF THE INVENTION

The present invention relates to cooling devices and more particularly to the CPU (central processing unit) and to the electronic chipset with high power density cooling devices with improved characteristics.

BACKGROUND OF THE INVENTION

It is known that high heat can be generated by an enabled electronic chipset such as a CPU and a VGA in a computer. This is particularly true for Pentium series CPUs. A cooler is typically mounted on the CPU for ventilating heat. However, prior CPU coolers have suffered certain deficiencies such as low efficiency, large space, shortened useful life, limited flexibility, and unreliability. Thus, continuing improvements in the development of the cooling device for the electronic chipset with high power density such as a CPU cooler are constantly being sought.

SUMMARY OF THE INVENTION

It is therefore an object of the present invention to provide a cooler for a high-power electronic chipset comprising a fan; a rectangular heat sink including four side legs securely snapped together with the chipset for forming a space between an underside of the heat sink and a top of the chipset and a plurality of apertures arranged in a form of rows and columns; and a guide member coupled between the fan and a top of the heat sink, the guide member comprising a side opening in communication with the fan and a plurality of holes each abutted on a top of a corresponding one of the apertures to be in fluid communication therewith; wherein a path of jets set up by the activated fan is from the fan to the top of the chipset via the opening, the holes, the apertures, and the space.

It is another object of the present invention to provide a cooler for a chipset or CPU comprising a fan; and a rectangular heat sink including four side legs securely snapped together with the chipset or CPU for forming a space between an underside of the heat sink and a top of the chipset or CPU and a plurality of apertures arranged in a form of rows and columns; wherein a path of jets set up by the activated fan is from the fan to the top of the chipset or CPU via the apertures and the space.

It is a further object of the present invention to provide a cooler for a chipset or CPU comprising a fan; and a rectangular heat sink including four side legs securely snapped together with the chipset or CPU for forming a space between an underside of the heat sink and a top of the chipset or CPU, a plurality of first apertures in a central portion, and a plurality of second apertures around the first apertures, the second apertures being smaller than the first apertures and the first and the second apertures being arranged in a form of rows and columns; wherein a path of jets set up by the activated fan is from the fan to the top of the chipset or CPU via the first and the second apertures and the space. This can effectively cool the hotter central portion of the chipset or CPU by increasing local jet momentum impinged thereon.

In one aspect of the present invention, the heat sink is bent to form a raised central portion, a raised periphery portion, and a recessed portion between the central portion and the periphery portion in which the vortical flow structure is occurred by jets reflected from the impinged top surface of the chipset or CPU in a space confined by each portion. Also, an entrainment phenomenon for the jet is enhanced by the vortical flow confined in the central portion. The enhanced entrainment phenomenon can increase strength and flow rate of the jets impinged onto the top of the chipset or CPU and decrease a confinement of the jets in the central portion of jets array. As a result, an optimum heat dissipation effect still can be achieved when a distance between the underside of the heat sink and the top of the chipset or CPU is relatively small. This configuration is particularly applicable to a more compact chipset or CPU cooler.

In another aspect of the present invention, the heat sink further comprises a plurality of troughs on a surface thereof.

The above and other objects, features and advantages of the present invention will become apparent from the following detailed description taken with the accompanying drawings.

DETAILED DESCRIPTION OF THE PREFERRED EMBODIMENTS

Figure 1:
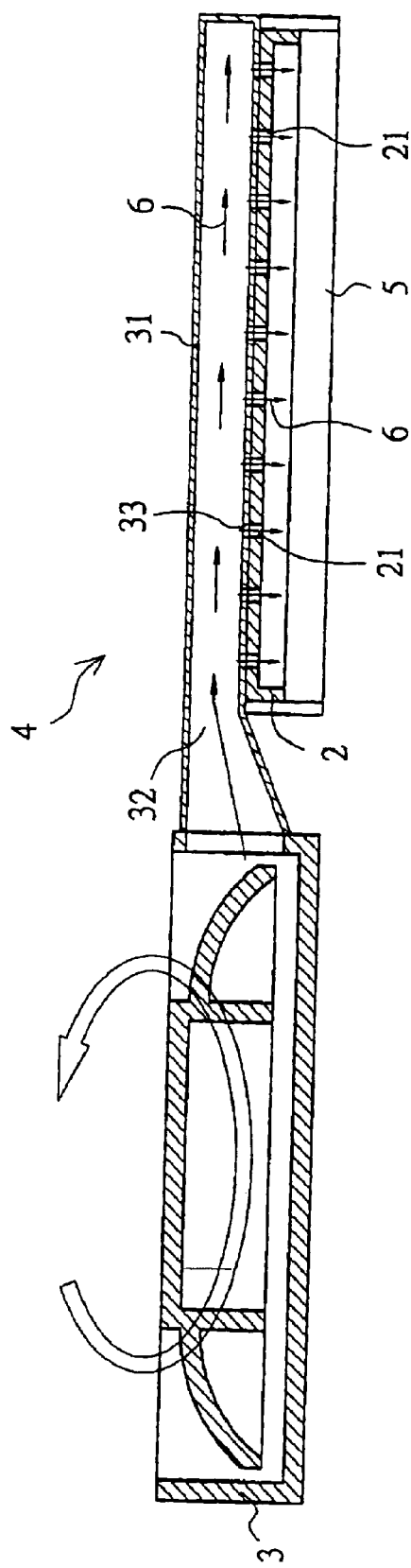
FIG. 1 is a cross-sectional view of a first preferred embodiment of a cooler mounted on a chipset or CPU according to the invention.

Referring to FIG. 1, there is shown a cooler 4 mounted on a high power electronic chip chipset or CPU 5 in accordance with a first preferred embodiment of the invention. The cooler 4 comprises a fan 3, a guide member 31, and a heat sink 2 in which the fan 3 is well known. Thus a detailed description thereof is omitted herein for the sake of brevity. The heat sink 2 is in a form of rectangle or square including four side legs securely snapped together with the chipset or CPU 5. The heat sink 2 comprises a plurality of apertures 21 arranged in a form of rows and columns. The guide member 31 is coupled between the fan 3 and the top of the heat sink 2. The guide member 31 comprises a side opening 32 in communication with the fan 3 and a plurality of holes 33 each abutted on the top of a corresponding one of the apertures 21 to be in fluid communication therewith. A jet is set up when the fan 3 is powered on. A path of jets 6 is from the fan 3 to the top of the chipset or CPU 5 via the opening 32, the holes 33, the apertures 21, and a space between the underside of the heat sink 2 and the top of the chipset or CPU 5. As a result, the chipset or CPU 5 is cooled by the cold air.

Figure 2:
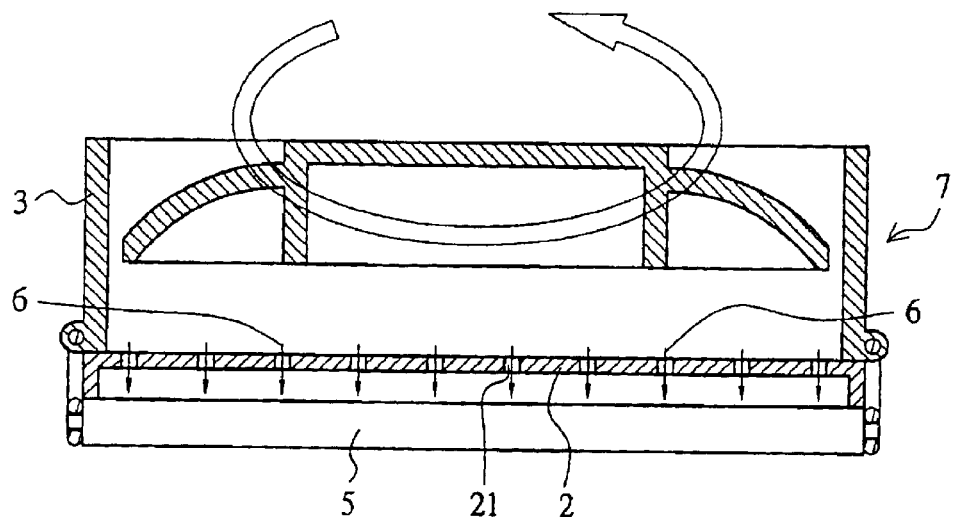
FIG. 2 is a cross-sectional view of a second preferred embodiment of a cooler mounted on the chipset or CPU according to the invention where a path of jets is shown.

Referring to FIG. 2, there is shown a cooler 7 mounted on the chipset or CPU 5 in accordance with a second preferred embodiment of the invention. The differences between the first and the second preferred embodiments, i.e., the characteristics of the second preferred embodiment are detailed below. The fan 3 is directly mounted on the heat sink 2. Hence, the path of jets 6 is from the activated fan 3 to the top of the chipset or CPU 5 via the apertures 21 and the space between the underside of the heat sink 2 and the top of the chipset or CPU 5.

Figure 3:
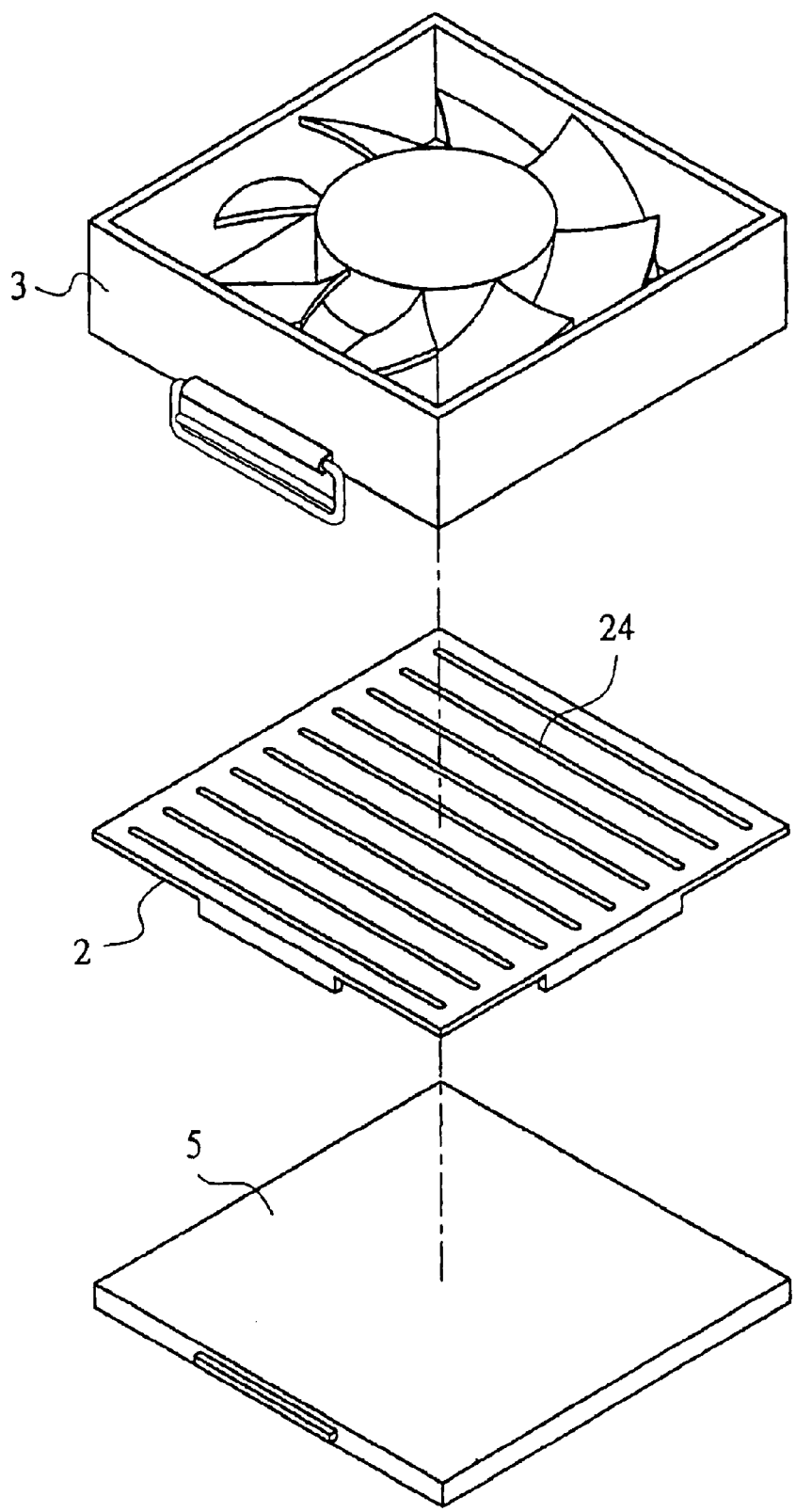
FIG. 3 is an exploded perspective view of a third preferred embodiment of a cooler to be mounted on the chipset or CPU according to the invention.

Referring to FIG. 3, there is shown a cooler mounted on the chipset or CPU 5 in accordance with a third preferred embodiment of the invention. The differences between the second and the third preferred embodiments, i.e., the characteristics of the third preferred embodiment are detailed below. The heat sink 2 further comprises a plurality of troughs 24 on its surface. Hence, a jet is set up when the fan 3 is powered on. A path of jets 6 is from the fan 3 to the top of the chipset or CPU 5 via the troughs 24. As a result, the chipset or CPU 5 is cooled by the cold air.

Figure 5:
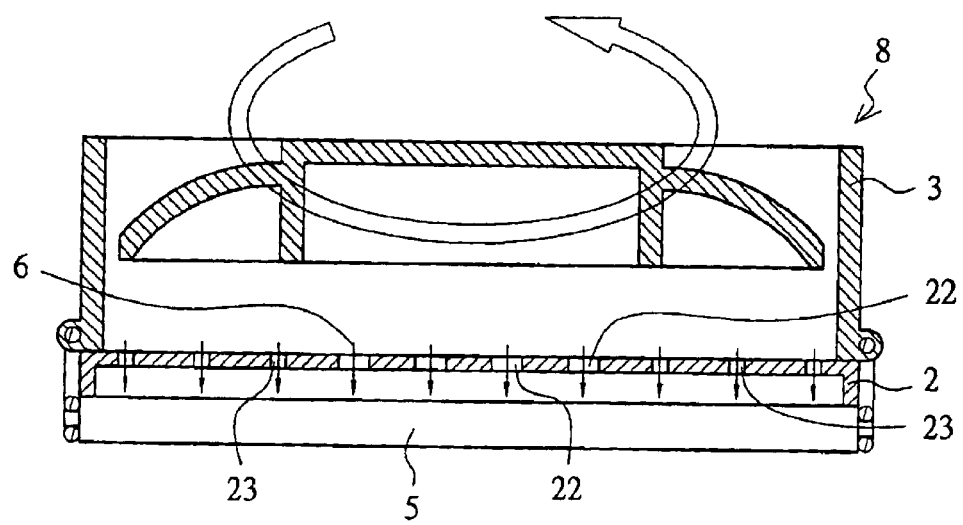
FIG. 5 is a cross-sectional view showing the cooler of FIG. 4 mounted on the chipset or CPU and the path of jets.
Figure 4:
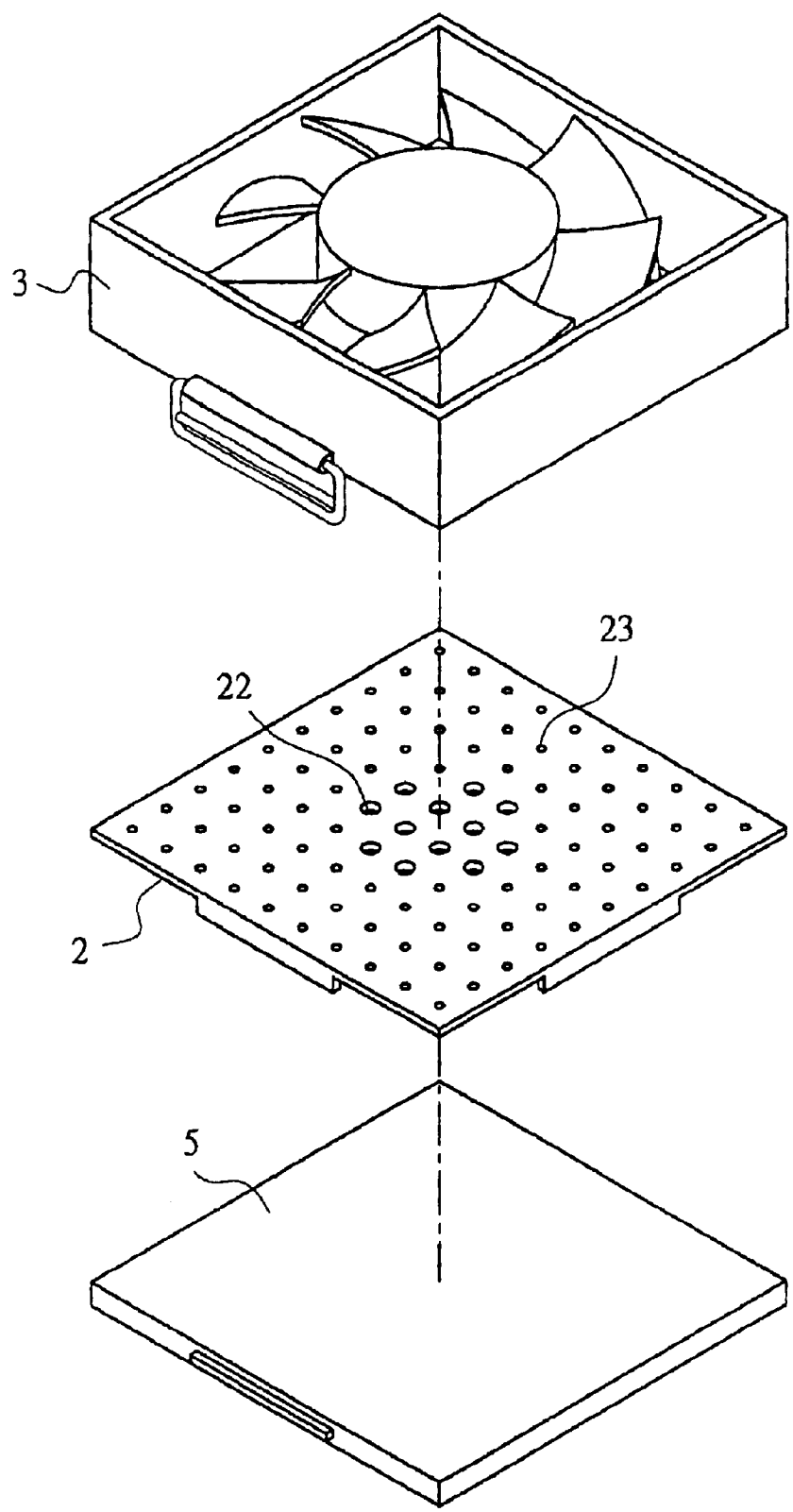
FIG. 4 is an exploded perspective view of a fourth preferred embodiment of a cooler to be mounted on the chipset or CPU according to the invention.

Referring to FIGS. 4 and 5, there is shown a cooler 8 mounted on the chipset or CPU 5 in accordance with a fourth preferred embodiment of the invention. The differences between the third and the fourth preferred embodiments, i.e., the characteristics of the fourth preferred embodiment are detailed below. The fan 3 is directly mounted on the heat sink 2. The heat sink 2 comprises a plurality of large apertures 22 in the central portion and a plurality of small apertures 23 around the larger apertures 22 in which both the apertures 22 and 23 are arranged in a form of rows and columns. The path of jets 6 is substantially the same as that shown in FIG. 2. This configuration aims at enhancing the cooling effect on the hotter portion of the chipset or CPU 5 by increasing local jet momentum impinged thereon.

Figure 6:
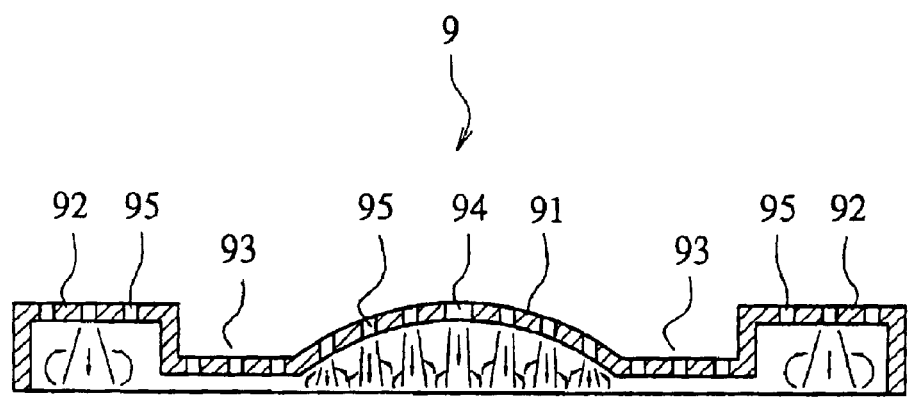
FIG. 6 is a cross-sectional view of a heat sink of a fifth preferred embodiment of the chipset or CPU cooler according to the invention where jets are shown.

Referring to FIG. 6, there is shown a heat sink 9 of a fifth preferred embodiment of the chipset or CPU cooler according to the invention. The differences between the fourth and the fifth preferred embodiments, i.e., the characteristics of the fifth preferred embodiment are detailed below. The heat sink 9 comprises a raised central portion 91, a raised periphery portion 92, and a recessed portion 93 between the central portion 91 and the periphery portion 92. But the underside of the recessed portion 93 is slightly above the top of the chipset or CPU 5, i.e., the space between the underside of the heat sink 9 and the top of the chipset or CPU 5 is not divided by the different portions 91, 92, and 93. A plurality of large apertures 94 are provided on the central portion of the central portion 91 while a plurality of small apertures 95 are provided on the remained portion of the heat sink 2. A vortical flow structure is occurred by jets reflected from the impinged top surface of the chipset or CPU 5 in a space confined by each portion 91, 92, or 93. Also, an enhanced entrainment phenomenon is occurred by the vortical flows. The enhanced entrainment phenomenon can increase the momentum and flow rate of the jets impinged onto the top of the chipset or CPU. This configuration can also decrease a confinement of jets in each portion 91, 92, or 93. As a result, an optimum heat dissipation effect still can be achieved when a distance between the underside of the heat sink 9 and the top of the chipset or CPU 5 is relatively small.

This configuration is particularly applicable to a more compact chipset or CPU cooler.

While the invention has been described by means of specific embodiments, numerous modifications and variations could be made thereto by those skilled in the art without departing from the scope and spirit of the invention set forth in the claims.

What is claimed is:

1. A cooling device for a chipset comprising:

a fan;

a rectangular heat sink including four side legs securely snapped together with the chipset for forming a space between an underside of the heat sink and a top of the chipset and a plurality of apertures arranged in a form of rows and columns; and a guide member coupled between the fan and a top of the heat sink, the guide member comprising a side opening in communication with the fan and a plurality of holes each abutted on a top of a corresponding one of the apertures to be in fluid communication therewith;

wherein a path of jets set up by the activated fan is from the fan to the top of the chipset via the opening, the holes, the apertures, and the space.

2. The cooling device of claim 1, wherein the heat sink further comprises a plurality of troughs on a surface thereof.

3. A cooling device for a chipset comprising:

a fan; and a rectangular heat sink including four side legs securely snapped together with the chipset for forming a space between an underside of the heat sink and a top of the chipset and a plurality of apertures arranged in a form of rows and columns;

wherein a path of jets set up by the activated fan is from the fan to the top of the chipset via the apertures and the space.

4. A cooling device for a chipset comprising:

a fan; and a rectangular heat sink including four side legs securely snapped together with the chipset for forming a space between an underside of the heat sink and a top of the chipset, a plurality of first apertures in a central portion, and a plurality of second apertures around the first apertures, the second apertures being smaller than the first apertures and the first and the second apertures being arranged in a form of rows and columns;

wherein a path of jets set up by the activated fan is from the fan to the top of the chipset via the first and the second apertures and the space.

5. The cooling device of claim 4, wherein the heat sink is bent to form a raised central portion, a raised periphery portion, and a recessed portion between the central portion and the periphery portion.

* * * * *